United States Patent
Tehranchi et al.

(10) Patent No.: US 10,875,004 B2
(45) Date of Patent: Dec. 29, 2020

(54) FLEXIBLE COLLOIDAL CRYSTAL HETEROSTRUCTURE AND MANUFACTURING METHOD THEREOF

(71) Applicants: Mohammad Mahdi Tehranchi, Tehran (IR); Zahra Sadat Azizi Yarand, Tehran (IR); Saeed Pourmahdian, Tehran (IR)

(72) Inventors: Mohammad Mahdi Tehranchi, Tehran (IR); Zahra Sadat Azizi Yarand, Tehran (IR); Saeed Pourmahdian, Tehran (IR)

(*) Notice: Subject to any disclaimer, the term of this patent is extended or adjusted under 35 U.S.C. 154(b) by 252 days.

(21) Appl. No.: 16/051,519

(22) Filed: Aug. 1, 2018

(65) Prior Publication Data

US 2018/0339281 A1    Nov. 29, 2018

Related U.S. Application Data

(60) Provisional application No. 62/542,313, filed on Aug. 8, 2017.

(51) Int. Cl.
| | |
|---|---|
| *B01J 13/20* | (2006.01) |
| *G02B 6/122* | (2006.01) |
| *H01L 21/02* | (2006.01) |
| *G02B 1/00* | (2006.01) |
| *B82Y 40/00* | (2011.01) |
| *B82Y 20/00* | (2011.01) |

(52) U.S. Cl.
CPC .............. *B01J 13/20* (2013.01); *G02B 1/005* (2013.01); *G02B 6/1225* (2013.01); *H01L 21/02601* (2013.01); *B82Y 20/00* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 6,680,013 B1 * | 1/2004 | Stein | B29C 67/202 264/44 |
| 6,858,079 B2 * | 2/2005 | Norris | B82Y 10/00 117/3 |

(Continued)

OTHER PUBLICATIONS

Jian Li et al., "Colloidal crystal heterostructures by a two-step vertical deposition method", 2007, Colloids and Surfaces A: Physicochem. Eng. Aspects, 295, pp. 107-112. (Year: 2007).*

(Continued)

*Primary Examiner* — Bo B Jang
(74) *Attorney, Agent, or Firm* — Bajwa IP Law Firm; Haris Zaheer Bajwa

(57) ABSTRACT

Disclosed herein is a method for fabricating a flexible colloidal crystal heterostructure. The method may include applying cold plasma treatment on a top surface of a flexible polymer substrate, horizontally depositing monodispersed polystyrene colloidal particles onto the top surface of the flexible polymer substrate, and creating a vertical temperature gradient in layers of monodispersed polystyrene colloidal particles. The vertical temperature gradient may be perpendicular to the top surface and may be created by heating an opposing bottom surface of the flexible polymer substrate.

14 Claims, 7 Drawing Sheets

(56) References Cited

U.S. PATENT DOCUMENTS

| | | | |
|---|---|---|---|
| 2002/0143073 A1* | 10/2002 | Jiang | C08J 9/26 |
| | | | 516/98 |
| 2008/0030837 A1* | 2/2008 | Ashrit | G02F 1/1523 |
| | | | 359/273 |
| 2012/0218653 A1* | 8/2012 | Liu | D06P 5/08 |
| | | | 359/868 |
| 2018/0164502 A1* | 6/2018 | Qin | G02B 6/1225 |

OTHER PUBLICATIONS

Qingsong Jiang et al., "Fabrication of photonic crystal heterostructures by a simple vertical deposition technique", 2014, J Mater Sci, 49, pp. 1832-1838. (Year: 2014).*

* cited by examiner

FLEXIBLE COLLOIDAL CRYSTAL HETEROSTRUCTURE AND MANUFACTURING METHOD THEREOF

CROSS-REFERENCE TO RELATED APPLICATION

This application claims the benefit of priority from U.S. Provisional Patent Application Ser. No. 62/542,313, filed on Aug. 8, 2017, and entitled "METHOD OF FABRICATING A FLEXIBLE COLLOIDAL CRYSTAL HETEROSTRUCTURE," which is incorporated herein by reference in its entirety.

TECHNICAL FIELD

The present disclosure generally relates to colloidal crystal heterostructures and particularly to a method for fabricating flexible colloidal crystal heterostructures.

BACKGROUND

Photonic crystals are composite structures that are made of at least two dielectric materials. The photonic crystals have a periodic dielectric structure with a band gap that prevents propagation of a certain frequency range of light. Photonic crystals may be regarded as optical semiconductors due to their ability to control the flow of light in a similar manner as what semiconductors do for electrons.

In order to increase the capabilities of photonic crystals in photonic devices, however, colloidal photonic crystals with more complex structures are desirable. Apart from introducing point, rod, and planar defects in the photonic crystals, one of the approaches for obtaining colloidal photonic crystal heterostructures is the incorporation of different stackings of photonic crystals. A colloidal crystal heterostructure consists of at least two optically contacting photonic crystals with their optical band gaps being slightly different from each other. The optically contacting photonic crystals may differ in either refractive indices, sizes of their components, or the geometry of their lattices. Well-ordered colloidal crystal heterostructures may be fabricated by stacking photonic crystal layers sequentially on a substrate in a direction perpendicular to the substrate. Examples of these colloidal crystal heterostructures include two-layer photonic crystal films, sandwich-like colloidal crystals, and colloidal photonic superlattices.

In a colloidal crystal heterostructure that is fabricated using a layer-by-layer approach, since different colloidal crystals are grown on top of each other in distinct multiple steps, structural imperfections might appear at the interface between the stacked constituent colloidal crystals. The structural imperfections may include lattice truncation, lattice mismatch, and interface disorder.

There is, therefore a need in the art for a fabrication method that allows fabrication of a colloidal crystal heterostructure with a defect-free interface between the constituent colloidal crystals. There is further a need in the art for a fabrication method that allows fabrication of a flexible colloidal crystal heterostructure by depositing a colloidal crystal heterostructure on a flexible substrate.

SUMMARY

According to one or more exemplary embodiments, a method for fabricating a flexible colloidal crystal heterostructure is disclosed. The method may include: applying cold plasma treatment on a top surface of a flexible polymer substrate, horizontally depositing monodispersed polystyrene colloidal particles onto the top surface of the flexible polymer substrate, and creating a vertical temperature gradient in layers of monodispersed polystyrene colloidal particles. The vertical temperature gradient may be perpendicular to the top surface and may be created by heating an opposing bottom surface of the flexible polymer substrate.

According to some exemplary embodiments, horizontally depositing monodispersed polystyrene colloidal particles onto the top surface of the flexible polymer substrate may include dropwise addition of monodispersed polystyrene colloidal particles on the top surface of the flexible polymer substrate.

According to some exemplary embodiments, heating the opposing bottom surface of the flexible polymer substrate may include placing a flat heating system with a predetermined temperature in contact with the bottom surface. According to some embodiments, the predetermined temperature may be in a range between 35° C. and 110° C. According to an exemplary embodiment, heating the opposing bottom surface of the flexible polymer substrate may be carried out for a duration between 10 minutes and 60 minutes.

According to one or more exemplary embodiments, creating a vertical temperature gradient in the emulsion of monodispersed polystyrene colloidal particles may include creating a vertical temperature gradient of 20° C. mm$^{-1}$.

According to some exemplary embodiments, applying cold plasma treatment on a top surface of a flexible polymer substrate may include applying cold plasma treatment on a top surface of a polyethylene terephthalate substrate.

According to some exemplary embodiments, horizontally depositing monodispersed polystyrene colloidal particles onto the top surface of the flexible polymer substrate may include horizontally depositing an emulsion of monodispersed polystyrene colloidal particles with a concentration between 1.5 wt. % to 2 wt. % based on total weight of the emulsion.

According to some exemplary embodiments, applying cold plasma treatment on a top surface of a flexible polymer substrate includes exposing the top surface to a 1200 W gliding arc discharge plasma for a duration between 4 seconds and 8 second.

According to some exemplary embodiments, exposing the top surface to a 1200 W gliding arc discharge plasma may include exposing the top surface to the 1200 W gliding arc discharge plasma by placing the top surface at a distance between 3 cm and 10 cm from the gliding arc discharge plasma.

According to one or more exemplary embodiments, a method for depositing a colloidal crystal heterostructure on a flexible polymer substrate is disclosed. The method may include applying cold plasma treatment on a top surface of the flexible polymer substrate, depositing an emulsion of monodispersed polystyrene colloidal particles onto the top surface, and self-assembling a colloidal crystal heterostructure on the top surface by drying the emulsion of monodispersed polystyrene colloidal particles. Drying the emulsion of monodispersed polystyrene colloidal particles may include creating a vertical temperature gradient in the emulsion of monodispersed polystyrene colloidal particles.

BRIEF DESCRIPTION OF THE DRAWINGS

The drawing figures depict one or more implementations in accord with the present teachings, by way of example

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Disclosed herein is a method for fabricating a flexible colloidal crystal heterostructure. The flexible colloidal heterostructure may be fabricated by depositing a colloidal crystal heterostructure on a flexible polymer substrate. An emulsion of monodispersed colloidal particles may be deposited onto the surface of a flexible polymer substrate of exemplary embodiments of the present disclosure and then by creating a vertical temperature gradient in the emulsion, a colloidal crystal heterostructure may be self-assembled on the flexible polymer substrate. The exemplary self-assembled colloidal crystal heterostructure may include an ordered stack of photonic crystals with different lattice constants.

Figure 1:
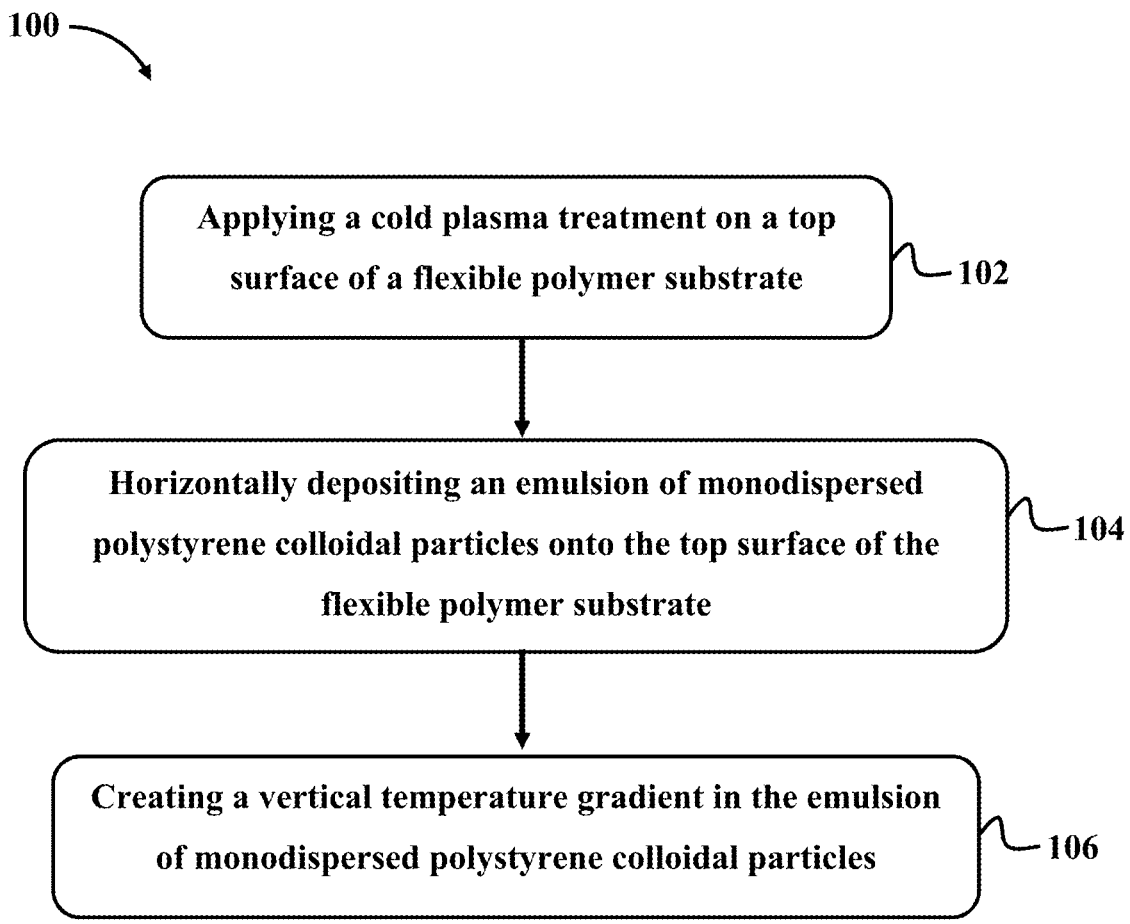
FIG. 1 illustrates a method for fabricating a flexible colloidal crystal heterostructure, consistent with one or more exemplary embodiments of the present disclosure.

FIG. 1 illustrates method 100 for fabricating a flexible colloidal crystal heterostructure, consistent with one or more exemplary embodiments of the present disclosure. Method 100 may include step 102 of applying cold plasma treatment on a top surface of a flexible polymer substrate, step 104 of horizontally depositing an emulsion of monodispersed polystyrene colloidal particles onto the top surface of the flexible polymer substrate, and step 106 of creating a vertical temperature gradient in the emulsion of monodispersed polystyrene colloidal particles. According to some exemplary embodiments, the vertical temperature gradient may be created perpendicular to the top surface of the flexible polymer by heating an opposing bottom surface of the flexible polymer substrate.

Referring to FIG. 1, according to one or more exemplary embodiments, step 102 may involve improving the hydrophilicity of the top surface of the flexible polymer substrate by applying the cold plasma treatment. According to one or more exemplary embodiments, the flexible polymer substrate may be exposed to a gliding arc discharge plasma at a predetermined discharge distance for a predetermined treatment time. According to an exemplary embodiment, a super-arc device capable of producing 1200 watts gliding discharge plasma with 4 cm plasma width and 10 cm plasma length may be utilized for creating and applying high-density cold plasma on the flexible polymer substrate. According to one or more exemplary embodiments, the predetermined discharge distance may be between 3 cm and 10 cm and the predetermined treatment time may be between 4 sec and 8 sec. The application of cold atmospheric plasma treatment increases the hydrophilicity of the top surface of the flexible polymer substrate and prepares the top surface to function as a flexible substrate for the self-assembly of colloidal heterostructure of exemplary embodiments of the present disclosure.

Figure 3A:
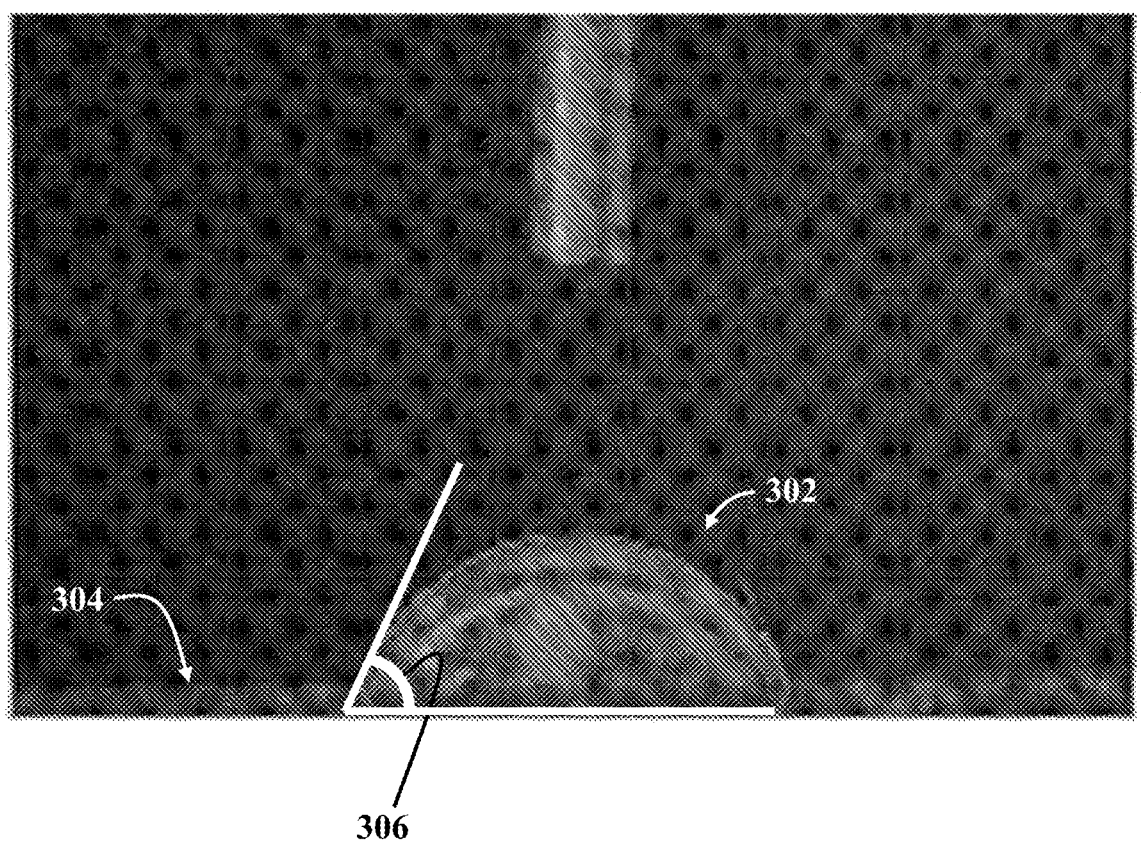
FIG. 3A illustrates a droplet contact angle with a top surface of a polymer substrate, consistent with one or more exemplary embodiments of the present disclosure.
Figure 3B:
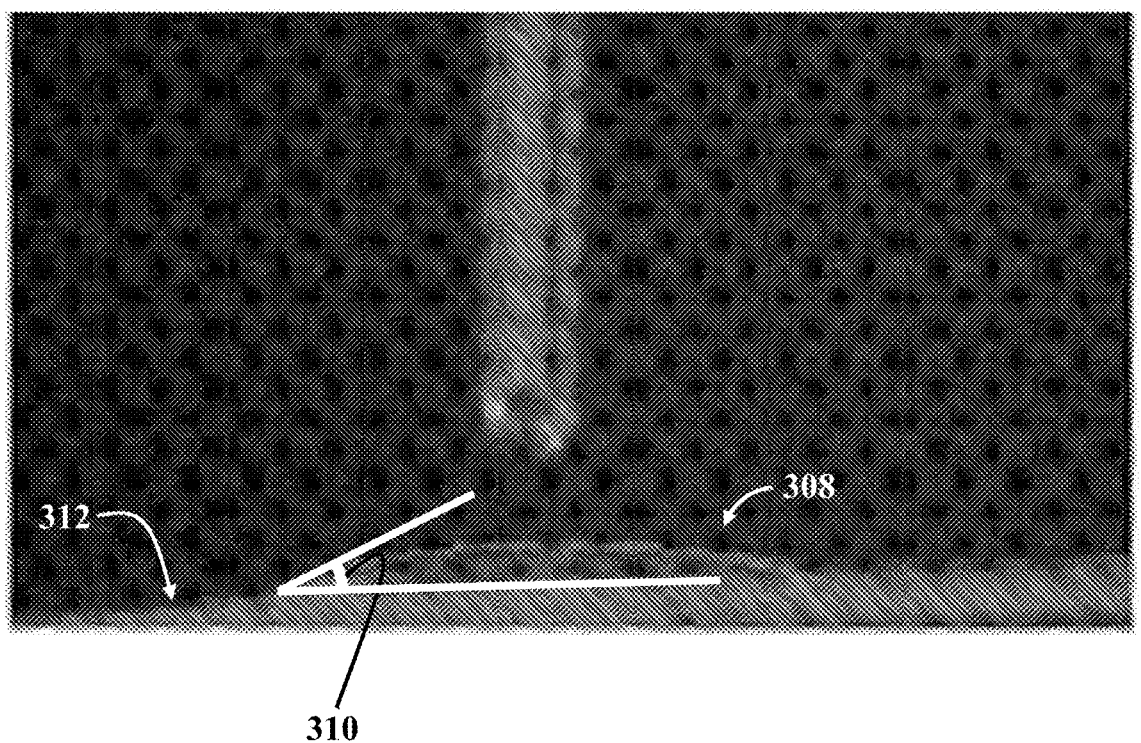
FIG. 3B illustrates a droplet contact angle with a plasma-treated top surface of a polymer substrate, consistent with one or more exemplary embodiments of the present disclosure.

FIG. 3A illustrates a droplet 302 contact angle 306 with a top surface 304 of a polymer substrate, consistent with one or more exemplary embodiments of the present disclosure, and FIG. 3B illustrates a droplet 308 contact angle 310 with a plasma-treated top surface 312 of a polymer substrate, consistent with one or more exemplary embodiments of the present disclosure. The polymer substrate in the exemplary embodiments shown in FIGS. 3A and 3B is a polystyrene sheet. Top surface 304 of the polystyrene sheet is not treated with the cold plasma, while top surface 312 of the polystyrene sheet is treated by a 1200 watts gliding arc discharge plasma with 4 cm plasma width and 10 cm plasma length with a discharge distance of 5 cm for a treatment period of 8 seconds. Referring to FIGS. 3A and 3B, the average contact angle or wetting angle for the polystyrene sheet before the plasma treatment, i.e., contact angle 306, is approximately 77.3° and the average contact angle or wetting angle for the polystyrene sheet after the plasma treatment, i.e., contact angle 310, is approximately 16.6°. The free energy at the interface varies linearly with cosine of the contact angle, therefore the reduction in the contact angle after the plasma treatment shows an increase in the hydrophilicity of the top surface 312 of the plasma-treated polystyrene sheet. Referring to FIG. 1, according to one or more exemplary embodiments, step 102 of applying cold plasma treatment on the top surface of the flexible polymer substrate may increase the hydrophilicity of the top surface and may further increase the adhesion and durability of the colloidal crystal heterostructure subsequently self-assembled thereon.

According to one or more exemplary embodiment, the flexible polymer substrate may be a polyethylene terephthalate substrate, polyvinylpyrrolidone (PVP), or other flexible polymers.

Referring to FIG. 1, according to one or more exemplary embodiments, step 104 of horizontally depositing an emulsion of monodispersed polystyrene colloidal particles onto the top surface of the flexible polymer substrate may include synthesizing polystyrene colloidal nano-spheres. The monodispersed polystyrene spherical colloidal particles may be prepared in various sizes and then these spherical colloidal particles may be assembled in highly ordered three-dimensional crystalline arrays to form a photonic crystal capable of diffracting light and propagating the direction of incident light. The photonic band gap can be shifted by changing the size of the spherical colloidal particles. The position of photonic band gap is mainly determined by the periodic structure and packing factor of the spherical colloidal particles. According to Bragg's law, any variation in center-to-center distance of colloidal particles could affect the band gap areas.

According to one or more exemplary embodiments, step 104 includes synthesizing polystyrene colloidal nano-spheres by an emulsifier-free emulsion polymerization (EFEP). Anionic polystyrene nano-spheres may be obtained using potassium persulfate (KPS) as an initiator. In an exemplary embodiment, the EFEP method may be carried out in a three-necked, round-bottomed flask equipped with a reflux condenser and a nitrogen inlet. Here, 6 ml of styrene and 5 g/l of a polyvinylpyrrolidone (PVP) solution may be added to 50 ml of deionized water under gentle magnetic stirring at room temperature. The mixture of styrene, PVP, and water may be stirred at about 600 rpm for 30 min. Before adding the initiator, the mixture may be placed in a liquid silicone bath at 80° C. with the protection of nitrogen gas. When the temperature of the mixture reaches 80° C., a solution of KPS may be added to the mixture to initiate polymerization. The reaction may continue at 80° C. for 24 hours. Finally, the resultant mixture may be slowly cooled down to room-temperature. The resultant mixture is an emulsion of monodispersed single-sized polystyrene colloidal nano-spheres.

Referring to FIG. 1, according to one or more exemplary embodiments, step 104 may further include horizontally depositing the synthesized emulsion of monodispersed polystyrene colloidal nano-spheres onto the top surface of the flexible polymer substrate. Horizontal deposition may refer to synthesized emulsion with a predetermined concentration being drop casted onto the top surface of the flexible polymer substrate to completely cover the top surface. The thickness of the deposited emulsion depends on the emulsion density and the number of droplets casted on the top surface. According to an exemplary embodiment, the synthesized emulsion of monodispersed polystyrene colloidal nano-spheres may have a concentration between 1.5 wt. % and 2 wt. %. In order for the colloidal crystal heterostructure to self-assemble on the top surface, the emulsion layer must be heated and dried.

With reference to FIG. 1, according to one or more exemplary embodiments, step 106 may involve creating a vertical temperature gradient in the emulsion of monodispersed polystyrene colloidal particles by heating an opposing bottom surface of the flexible polymer substrate.

Figure 2:
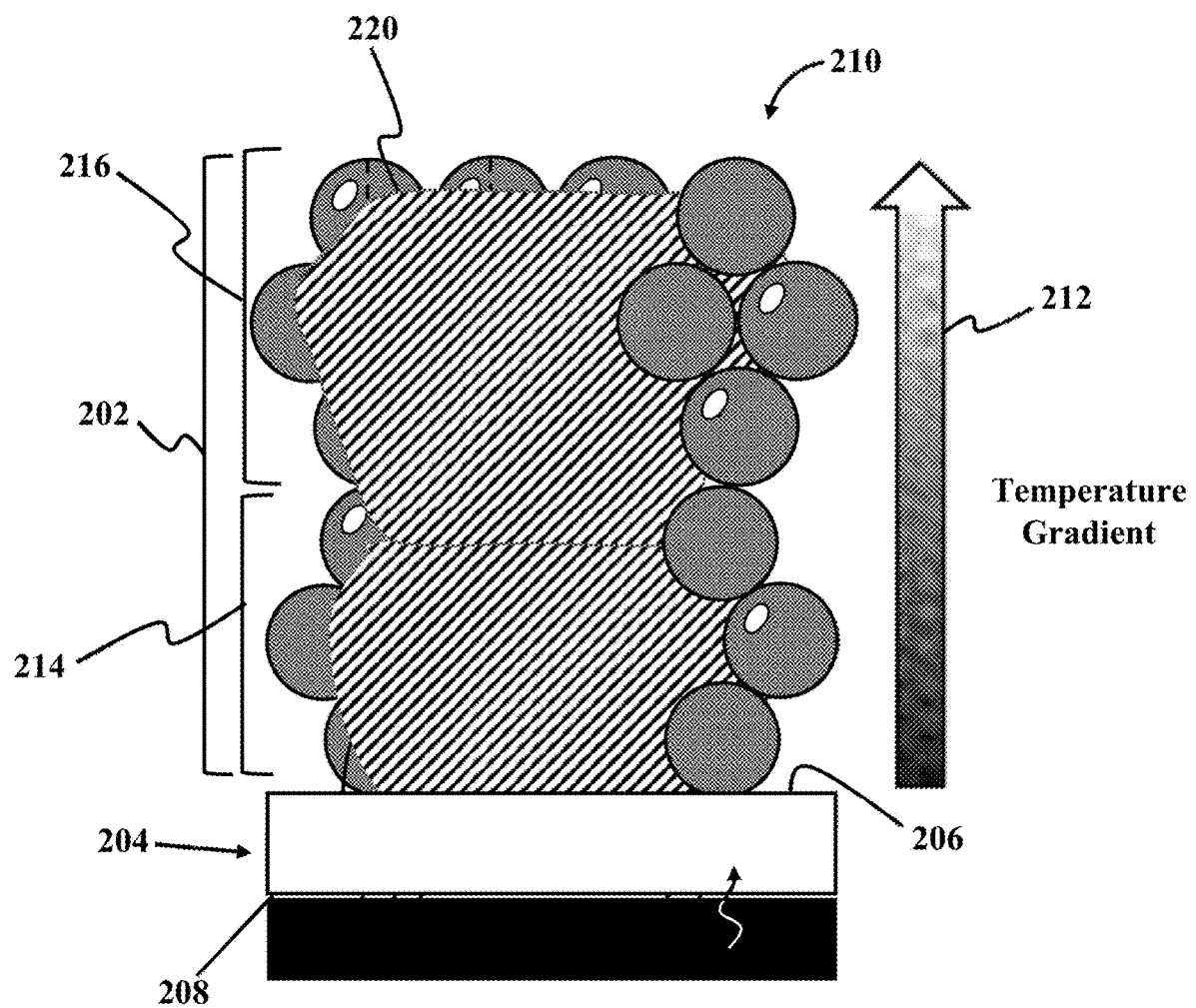
FIG. 2 illustrates a schematic of a colloidal crystal heterostructure being self-assembled on a flexible plasma-treated substrate, consistent with one or more exemplary embodiments of the present disclosure.

For purposes of explanation, FIG. 2 illustrates a schematic of a colloidal crystal heterostructure 202 being self-assembled on a flexible plasma-treated substrate 204, consistent with one or more exemplary embodiments of the present disclosure. The plasma-treated substrate 204 includes a top surface 206 and an opposing bottom surface 208. The top surface 206 may be treated by cold plasma according to step 102 of method 100 as was described in connection with FIG. 1. Synthesized emulsion 210 of monodispersed polystyrene colloidal nano-spheres may be deposited on the top surface 206 according to step 104 of method 100 as was described in connection with FIG. 1. After that, in step 106, the opposing bottom surface 208 may be heated by a heat source placed in contact with the bottom surface 208. The heat source may be a flat heating system with a predetermined temperature. Heating the plasma-treated substrate 204 from the bottom surface 208 creates a vertical temperature gradient in synthesized emulsion 210 in a direction perpendicular to the top surface 206 as shown by arrow 212. The temperature decreases vertically in the synthesized emulsion 210 as the distance from the top surface 206 increases moving from a lower portion 214 of the emulsion 210 to an upper portion 216 of the emulsion 210. In other words, the lower portion 214 undergoes drying at a higher temperature and the upper portion 216 undergoes drying at a lower temperature. Due to the difference between the drying temperatures of the lower portion 214 and the upper portion 216, the rate of solvent evaporation is different in the lower portion 214 and the upper portion 216. In the lower portion 214, due to a higher temperature, the solvent evaporates faster than the upper portion 216 and this leads the capillary force to move the colloidal nano-spheres closer to each other in the lower portion 214 in comparison with the upper portion 216. As a result, center-to-center distance 218 of the colloidal nano-spheres in the lower portion 214 is smaller than center-to-center distance 220 of the colloidal nano-spheres in the upper portion. It should be noted that, center-to-center distance 218 represents lattice constant of the lower portion 214 and center-to-center distance 220 represents lattice constant of the upper portion 216. As a result of the creation of the vertical temperature gradient and the drying process of the lower portion 214 and the upper portion 216 with different rates, colloidal crystal heterostructure 202 self-assembles with two different lattice constants in the upper portion 216 and the lower portion 214 of the colloidal crystal heterostructure 202.

Referring to FIGS. 1 and 2, according to one or more exemplary embodiments, first the plasma-treated substrate 204 may be heated to reach the predetermined temperature according to step 106 of method 100 and then the emulsion 210 of the synthesized monodispersed polystyrene colloidal nano-spheres may be deposited onto the top surface 206 of the plasma-treated substrate 204.

Referring to FIG. 2, according to one or more exemplary embodiments, the heat source may have a predetermined temperature between 35° C. and 110° C. Heating the bottom surface may be carried out for a period between 10 minutes and 60 minutes. Referring back to FIG. 1, according to one or more exemplary embodiments, step 106 of creating a vertical temperature gradient in the layer of monodispersed polystyrene colloidal particles may include creating a vertical temperature gradient of 20° C. mm$^{-1}$.

Example 1

In this example, a colloidal crystal heterostructure is fabricated by method 100 of FIG. 1, consistent with one or more exemplary embodiments of the present disclosure. Here, a super-arc device capable of producing 1200 watts gliding discharge plasma with 4 cm plasma width and 10 cm plasma length was utilized for creating and applying high-density cold plasma on a flexible polyethylene terephthalate substrate with a discharge distance of 5 cm for 8 sec. An emulsion of monodispersed polystyrene spheres with diameters of 260 nm and a concentration of 1.5 wt. % was drop casted onto the top surface of the plasma-treated polyethylene terephthalate substrate, such that the emulsion covered the entire top surface of the plasma-treated substrate. An opposing bottom surface of the plasma-treated polyethylene terephthalate substrate was heated by a flat heating system in contact with the entire bottom surface of the substrate at a temperature of 50° C. for 20 minutes to create a vertical temperature gradient in layers of the drop-casted emulsion. Creation of this vertical temperature gradient leads to the formation of two stacks of colloidal crystals with two distinct lattice constants, which may be confirmed by scanning electron microscopy of the fabricated colloidal crystal heterostructure.

Figure 4A:
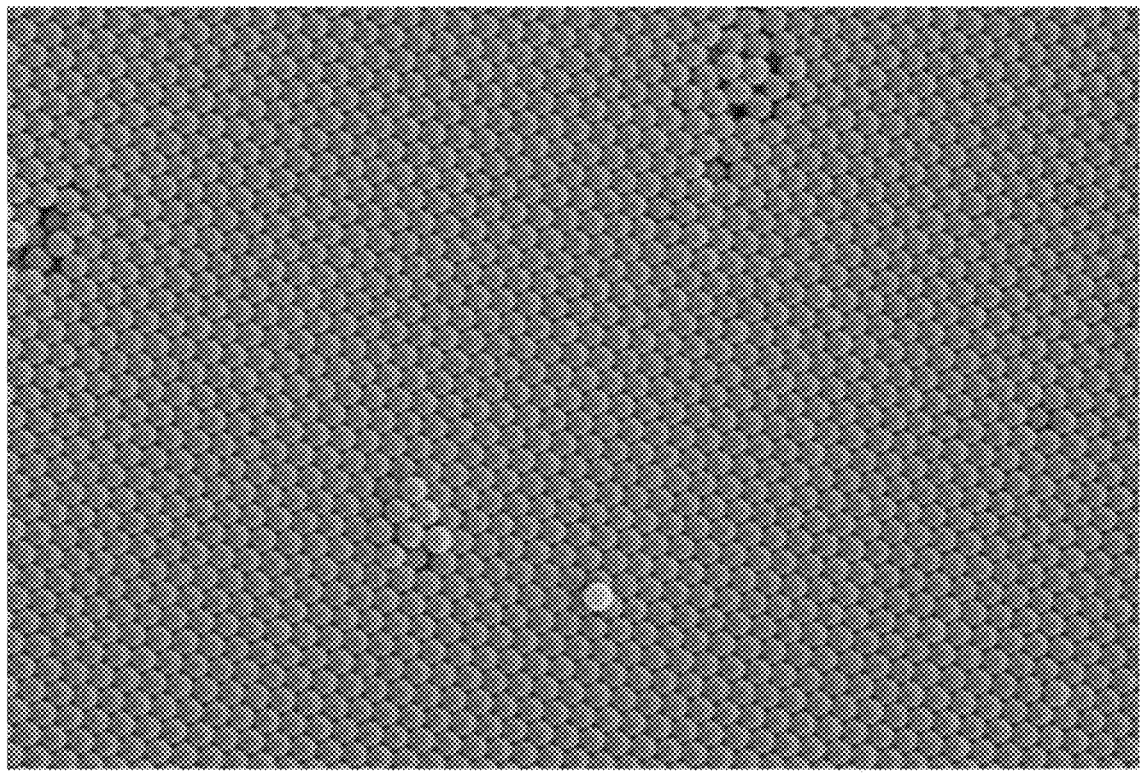
FIG. 4A illustrates a top-view scanning electron microscope (SEM) image of an exemplary colloidal crystal heterostructure, consistent with an exemplary embodiment of the present disclosure.

FIG. 4A illustrates a top-view scanning electron microscope (SEM) image 401 of the exemplary colloidal crystal heterostructure fabricated as described above and FIG. 4B illustrates a lateral-view SEM image 402 of the same exemplary colloidal crystal heterostructure.

Referring to FIG. 4A, the top-view SEM image 401 of the exemplary colloidal crystal heterostructure shows a highly ordered photonic crystal that possesses a close-packed face-centered-cubic structure with the (1 1 1) planes oriented parallel to the top surface of the flexible substrate.

Figure 4B:
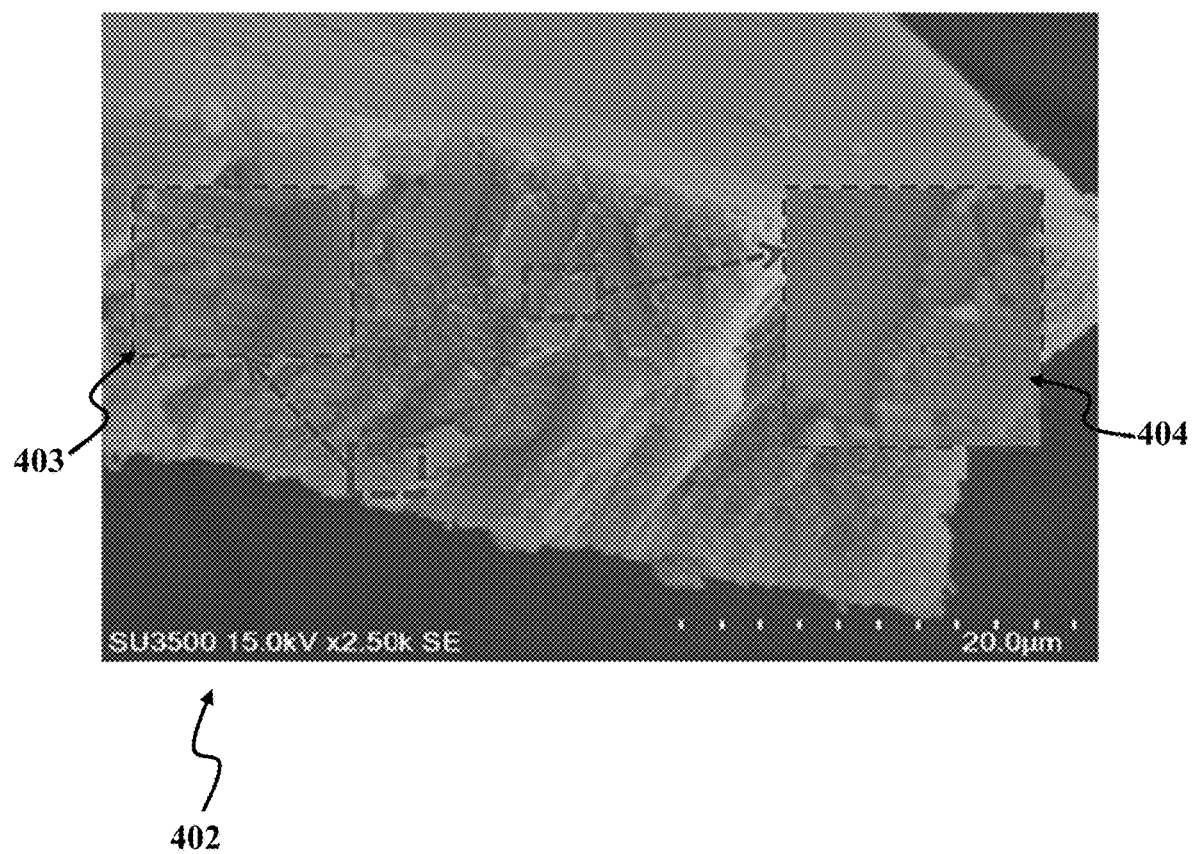
FIG. 4B illustrates a lateral-view SEM image of the exemplary colloidal crystal heterostructure of FIG. 4A.

Referring to FIG. 4B, the lateral-view SEM image 402 of the exemplary colloidal crystal heterostructure along with two magnified insets 403, 404 of the lower portion and upper portion of the exemplary colloidal crystal heterostructure, respectively show that the exemplary colloidal crystal heterostructure is composed of two stacks of colloidal crystals with two distinct lattice constants, one in the upper portion and the other in the lower portion. Further experimental analyses shows the difference of the lattice constants between the upper portion and the lower portion of the exemplary colloidal crystal heterostructure is around 18 nm.

Example 2

In this example, three samples of colloidal crystal heterostructures were synthesized with the same method as described in EXAMPLE 1, but at three different heating temperatures of 35° C., 50° C., and 60° C. In other words, the vertical temperature gradients created in the drying process of the three samples were different. Sample 1 was dried by heating a bottom surface of the flexible substrate by a flat heating system at a temperature of 35° C., Sample 2 was dried by heating a bottom surface of the flexible substrate by a flat heating system at a temperature of 50° C., and Sample 3 was dried by heating a bottom surface of the flexible substrate by a flat heating system at a temperature of 60° C.

Figure 5:
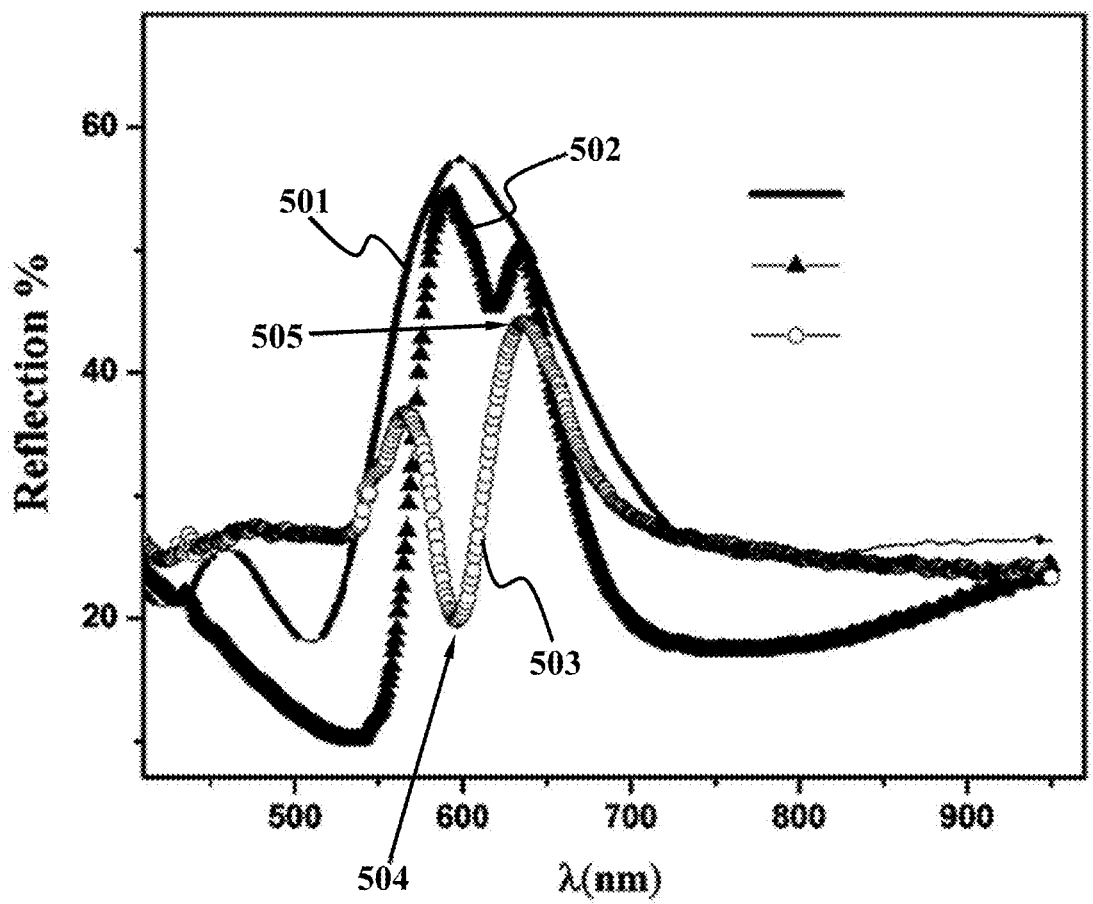
FIG. 5 illustrates reflectance spectra of the colloidal crystal heterostructure samples, consistent with one or more exemplary embodiments of the present disclosure.

FIG. 5 illustrates reflectance spectra 501, 502, and 503 of the colloidal crystal heterostructure samples, consistent with exemplary embodiments of the present disclosure. Reflectance spectrum of Sample 1 is designated by reference numeral 501, reflectance spectrum of Sample 2 is designated by reference numeral 502, and of Sample 3 is designated by reference numeral 503. Referring to FIG. 5, reflectance spectrum of Sample 3 (503) shows that the distance between the two Bragg reflection peaks 504 and 505 has increased in comparison with reflectance spectra 501 and 502 of the samples which were heated and dried at lower temperatures.

While the foregoing has described what are considered to be the best mode and/or other examples, it is understood that various modifications may be made therein and that subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study, except where specific meanings have otherwise been set forth herein. Relational terms such as "first" and "second" and the like may be used solely to distinguish one entity or action from another without necessarily requiring or implying any actual such relationship or order between such entities or actions. The terms "comprises," "comprising," or any other variation thereof, as used herein and in the appended claims are intended to cover a non-exclusive inclusion, encompassing a process, method, article, or apparatus that comprises a list of elements that does not include only those elements but may include other elements not expressly listed to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is not intended to be used to interpret or limit the scope or meaning of the claims. In addition, in the foregoing Detailed Description, it can be seen that various features are grouped together in various implementations. Such grouping is for purposes of streamlining this disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into this Detailed Description, with each claim standing on its own as a separately claimed subject matter.

While various implementations have been described, the description is intended to be exemplary, rather than limiting and it will be apparent to those of ordinary skill in the art that many more implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for fabricating a flexible colloidal crystal heterostructure, the method comprising:
   applying cold plasma treatment on a top surface of a flexible polymer substrate;
   horizontally depositing monodispersed polystyrene colloidal particles onto the top surface of the flexible polymer substrate; and
   creating a vertical temperature gradient in layers of the monodispersed polystyrene colloidal particles by heating an opposing bottom surface of the flexible polymer substrate, the vertical temperature gradient perpendicular to the top surface of the flexible polymer substrate.

2. The method according to claim 1, wherein horizontally depositing the monodispersed polystyrene colloidal particles onto the top surface of the flexible polymer substrate comprises dropwise addition of an emulsion of the monodispersed polystyrene colloidal particles on the top surface of the flexible polymer substrate.

3. The method according to claim 1, wherein heating the opposing bottom surface of the flexible polymer substrate includes placing a flat heating system with a predetermined temperature in contact with the opposing bottom surface.

4. The method according to claim 3, wherein the predetermined temperature is in a range between 35° C. and 110° C.

5. The method according to claim 4, wherein heating the opposing bottom surface of the flexible polymer substrate is carried out for a duration between 10 minutes and 60 minutes.

6. The method according to claim 1, wherein creating the vertical temperature gradient in the layers of the monodispersed polystyrene colloidal particles includes creating a vertical temperature gradient of 20° C. $mm^{-1}$.

7. The method according to claim 1, wherein the flexible polymer substrate comprises a polyethylene terephthalate substrate.

8. The method according to claim 1, wherein horizontally depositing the monodispersed polystyrene colloidal particles onto the top surface of the flexible polymer substrate includes horizontally depositing an emulsion of the monodispersed polystyrene colloidal particles with a concentration between 1.5 wt. % to 2 wt. % based on a total weight of the emulsion.

9. The method according to claim 1, wherein applying the cold plasma treatment on the top surface of the flexible polymer substrate includes exposing the top surface to a 1200 W gliding arc discharge plasma for a duration between 4 seconds and 8 seconds.

10. The method according to claim 9, wherein exposing the top surface to the 1200 W gliding arc discharge plasma includes exposing the top surface to the 1200 W gliding arc discharge plasma by placing the top surface at a distance between 3 cm and 10 cm from the 1200 W gliding arc discharge plasma.

11. A method for depositing a colloidal crystal heterostructure on a flexible polymer substrate, the method comprising:
    applying cold plasma treatment on a top surface of the flexible polymer substrate;
    depositing a layer of an emulsion of monodispersed polystyrene colloidal particles onto the top surface; and
    self-assembling a colloidal crystal heterostructure on the top surface by drying the layer of the emulsion of the monodispersed polystyrene colloidal particles,
    wherein drying the layer of the emulsion of the monodispersed polystyrene colloidal particles includes creating a vertical temperature gradient in the layer of the emulsion of the monodispersed polystyrene colloidal particles, the vertical temperature gradient perpendicular to the top surface.

12. The method according to claim 11, wherein creating the vertical temperature gradient in the layer of the emulsion of the monodispersed polystyrene colloidal particles includes creating a vertical temperature gradient of 20° C. $mm^{-1}$.

13. The method according to claim 11, wherein creating the vertical temperature gradient in the layer of the emulsion of the monodispersed polystyrene colloidal particles includes creating a vertical temperature gradient of 20° C. $mm^{-1}$ for a duration between 10 minutes and 60 minutes.

14. The method according to claim 11, wherein creating the vertical temperature gradient in the layer of the emulsion of the monodispersed polystyrene colloidal particles includes heating an opposing bottom surface of the flexible polymer substrate by a flat heating system with a temperature between 35° C. and 110° C.

* * * * *